US010295877B2

(12) United States Patent
Zhang

(10) Patent No.: US 10,295,877 B2
(45) Date of Patent: May 21, 2019

(54) ARRAY SUBSTRATE, LIQUID CRYSTAL DISPLAY PANEL AND MANUFACTURING METHOD FOR ARRAY SUBSTRATE

(71) Applicant: Shenzhen China Star Optoelectronics Technology Co., Ltd., Shenzhen, Guangdong (CN)

(72) Inventor: Mengmeng Zhang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 263 days.

(21) Appl. No.: 15/110,940

(22) PCT Filed: Jun. 12, 2016

(86) PCT No.: PCT/CN2016/085459
§ 371 (c)(1),
(2) Date: Jul. 11, 2016

(87) PCT Pub. No.: WO2017/201772
PCT Pub. Date: Nov. 30, 2017

(65) Prior Publication Data
US 2018/0164649 A1    Jun. 14, 2018

(30) Foreign Application Priority Data

May 23, 2016    (CN) .......................... 2016 1 0345005

(51) Int. Cl.
*G02F 1/1368*    (2006.01)
*G02F 1/1333*    (2006.01)
(Continued)

(52) U.S. Cl.
CPC .......... *G02F 1/1368* (2013.01); *G02F 1/1362* (2013.01); *G02F 1/133345* (2013.01);
(Continued)

(58) Field of Classification Search
CPC ......... G02F 1/133345; G02F 1/136209; G02F 1/1368
See application file for complete search history.

(56) References Cited

U.S. PATENT DOCUMENTS 6,255,705 B1 *  7/2001  Zhang ................ G02F 1/13454
                                           257/412
7,515,218 B2 *  4/2009  Song ..................... G02F 1/1309
                                           349/43
(Continued)

FOREIGN PATENT DOCUMENTS

CN      1508612 A      6/2004
CN    101067705 A    11/2007
(Continued)

*Primary Examiner* — Dung T Nguyen
(74) *Attorney, Agent, or Firm* — Andrew C. Cheng

(57) ABSTRACT

An array substrate includes a first light-shielding insulation layer formed on the substrate, for block a light entering the substrate, and including a first region and a second region, and each is made of an insulation material; a first function layer formed on the second region, under a light-shielding function of the second region, an affection of light is avoided; a second function layer formed above the first region of the first light-shielding insulation layer and the first function layer, under the light-shielding function of the first light-shielding insulation layer, an affection of light is avoided; and a third function layer formed above the second function layer, under the light-shielding function of the first light-shielding insulation layer, an affection of light is avoided; wherein, each of the first, the second and the third function layer is a conductor material or a semiconductor material. A photo-leakage current can be avoided.

8 Claims, 6 Drawing Sheets

(51) Int. Cl.
  *G02F 1/1362* (2006.01)
  *H01L 27/12* (2006.01)
(52) U.S. Cl.
  CPC .......... *G02F 1/136209* (2013.01); *G02F 2001/13625* (2013.01); *G02F 2001/136236* (2013.01); *G02F 2202/103* (2013.01); *H01L 27/12* (2013.01)

(56) References Cited

U.S. PATENT DOCUMENTS

| | | | |
|---|---|---|---|
| 7,659,947 B2* | 2/2010 | Arao | G02F 1/133512 |
| | | | 257/72 |
| 8,530,912 B2* | 9/2013 | Cheng | G02F 1/136209 |
| | | | 257/59 |
| 8,785,225 B2 | 7/2014 | Wang | |
| 2007/0200984 A1* | 8/2007 | Lee | H01L 51/524 |
| | | | 349/113 |
| 2012/0028385 A1 | 2/2012 | Hou | |
| 2016/0141314 A1 | 5/2016 | Zhang et al. | |

FOREIGN PATENT DOCUMENTS

| | | |
|---|---|---|
| CN | 101807584 B | 8/2010 |
| CN | 102236228 A | 11/2011 |
| CN | 103474430 B | 12/2013 |
| CN | 103926739 B | 7/2014 |
| CN | 104752489 A | 7/2015 |
| CN | 104950541 A | 9/2015 |
| JP | 2005285976 A | 10/2005 |

* cited by examiner

ARRAY SUBSTRATE, LIQUID CRYSTAL DISPLAY PANEL AND MANUFACTURING METHOD FOR ARRAY SUBSTRATE

BACKGROUND OF THE INVENTION

1. Field of the Invention

The present invention relates to a liquid crystal display field, and more particularly to an array substrate, a liquid crystal display panel and a manufacturing method for array substrate.

2. Description of Related Art

In the production of a Thin Film Transistor-Liquid Crystal Display (abbreviated as TFT-LCD), the current main technology is adopting five masks, that is, a five-mask process. In order to decrease the cost, the current research direction is decreasing the number of the masks.

Currently, many productions adopt four masks, that is, a four-mask process. The four-mask process generally combines an a-Si (abbreviated as AS) layer and a source electrode (abbreviated as SE) in the five masks to be one mask. The one mask adopts a Gray Tone Mask (GTM) technology or a Half Tone Mask (HTM) technology to perform a process. In the five-mask process, the a-Si layer only exists at a channel region. For a four-mask process, because the AS layer and the SE layer are manufactured by a same mask, below all metal lines of the SE layer, semiconductor a-Si is distributed, and including a data line that is distributed on the entire panel. When the panel is lighted up, a backlight is irradiated below the panel, the a-Si below the data line is irradiated so as to generate a photo-leakage current such that the performance of the TFT is deteriorated to some degree. The panel generates a crosstalk problem and an Image Sticking (IS) problem caused by the photo-leakage current.

In order to solve the problem that the a-Si below the data line is irradiated, a light-shielding layer maybe provided below the data line and the a-Si. In the current technology, one solution is that when using one mask for manufacturing the gate electrode (GE), a portion that required to be light shielded is manufactured on the GE mask. By this way, when manufacturing the data line, using a gate metal to manufacture a layer of light-shielding layer. The solution will not increase the mask cost and the exposure cost.

However, because the light-shielding layer is a metal such that the light-shielding layer and the data line will form a capacitor so as to affect the data transmission of the data line. If using a non-metal material to manufacture a light shielding layer, the price cost and the production time cost will increase.

SUMMARY OF THE INVENTION

The technology problem mainly solved by the present invention is to provide an array substrate, a liquid crystal display panel and a manufacturing method for an array substrate such that the a-Si below the data line will not be irradiated by a light in order to avoid a photo-leakage current problem without increasing the number of the masks and affecting the production capacity at the same time.

In order to solve the above technology problem, a technology solution adopted by the present invention is: providing an array substrate, comprising:

a substrate;

a first light-shielding insulation layer formed on the substrate, used for blocking a portion of light entering to the substrate, and including a first region and a second region disposed separately, wherein each of the first region and the second region is made of an insulation material;

a first function layer formed on the second region of the first light-shielding insulation layer, used for realizing a first function, and under a light-shielding function of the second region of the first light-shielding insulation layer, an affection of light is avoided;

a second function layer formed above the first region of the first light-shielding insulation layer, formed above the first function layer, used for realizing a second function, and under the light-shielding function of the first light-shielding insulation layer, an affection of light is avoided; and a third function layer formed above the second function layer, used for realizing a third function, and under the light-shielding function of the first light-shielding insulation layer, an affection of light is avoided;

wherein, each of the first function layer, the second function layer and the third function layer is a conductor material or a semiconductor material.

Wherein, the first function layer is a gate electrode of a gate layer, the second function layer is a-Si of a silicon layer, and the third function layer is a source electrode and a drain electrode of a source-drain layer and a data line of a data layer.

In order to solve the above technology problem, another technology solution adopted by the present invention is: providing a liquid crystal display panel, comprising:

a first substrate;

a second substrate disposed oppositely to the first substrate, and comprising:

a substrate;

a first light-shielding insulation layer formed on the substrate, used for blocking a portion of light entering to the substrate, and including a first region and a second region disposed separately, wherein each of the first region and the second region is made of an insulation material;

a first function layer formed on the second region of the first light-shielding insulation layer, used for realizing a first function, and under a light-shielding function of the second region of the first light-shielding insulation layer, an affection of light is avoided;

a second function layer formed above the first region of the first light-shielding insulation layer, formed above the first function layer, used for realizing a second function, and under the light-shielding function of the first light-shielding insulation layer, an affection of light is avoided; and a third function layer formed above the second function layer, used for realizing a third function, and under the light-shielding function of the first light-shielding insulation layer, an affection of light is avoided;

wherein, each of the first function layer, the second function layer and the third function layer is a conductor material or a semiconductor material; and a liquid crystal layer clamped between the first substrate and the second substrate.

Wherein, the first function layer is a gate electrode of a gate layer, the second function layer is a-Si of a silicon layer, and the third function layer is a source electrode and a drain electrode of a source-drain layer and a data line of a data layer.

In order to solve the above technology problem, another technology solution adopted by the present invention is: providing a manufacturing method for an array substrate, comprising:

sequentially forming a first light-shielding insulation layer and a first function layer on a substrate;

adopting a first mask for exposing and developing the first light-shielding insulation layer and the first function layer at one time to respectively obtain a first light-shielding insulation pattern and a first function pattern, wherein, the first light-shielding insulation pattern includes a hollow region and a light-shielding region; the light-shielding region includes a first region and a second region; the first function pattern includes a hollow region and a function region; the hollow region of the first function pattern is corresponding to the hollow region and the first region of the first light-shielding insulation pattern, the function region of the first function pattern is corresponding to the second region of the first light-shielding insulation pattern;

sequentially forming a second function layer and a third function layer above the first light-shielding insulation pattern and the first function pattern; and adopting a second mask for exposing and developing the second function layer and the third function layer at one time to respectively obtain a second function pattern and a third function pattern, wherein, each of the second function pattern and the third function pattern includes a hollow region and a function region; the function region of the second function pattern is corresponding to the function region of the third function pattern and the first region of the first light-shielding insulation pattern.

Wherein, the step of adopting a first mask for exposing and developing the first light-shielding insulation layer and the first function layer at one time to respectively obtain a first light-shielding insulation pattern and a first function pattern comprises:

coating a layer of photoresist on the first function layer;

using a first mask to perform a first exposure treatment to the substrate coated with the photoresist, wherein, the first mask includes: a fully light-transmitting region, a partly light-transmitting region and a light-blocking region; the fully light-transmitting region corresponds to the hollow region of the first light-shielding insulation pattern, the partly light-transmitting region corresponds to the first region of the first light-shielding insulation pattern, and the light-blocking region corresponds to the second region of the first light-shielding insulation pattern; and respectively adopting a developing technology and an etching technology to process the substrate after being performed with the first exposure treatment in order to respectively obtain the first light-shielding insulation pattern and the first function pattern.

Wherein, a material of the first light-shielding insulation layer is a black matrix.

Wherein, the step of adopting a developing technology and an etching technology to process the substrate after being performed with the first exposure treatment comprises:

performing a first development treatment to the substrate after being performed with the first exposure treatment in order to fully dissolve all of the photoresist corresponding to the fully light-transmitting region, partly dissolve part of the photoresist corresponding to the partly light-transmitting region;

performing a first etching treatment to the substrate after being performed with the first development treatment in order to remove the first function layer without covering with the photoresist;

performing a second etching treatment to the substrate after being performed with the first etching treatment in order to remove a portion of the photoresist covering on the first function layer, and removing the photoresist covered on the first function layer;

performing a third etching treatment to the substrate after being performed with the second etching treatment in order to remove the first function layer without covering with the photoresist;

performing a second exposure treatment to the substrate after being performed with the third etching treatment; and performing a second development treatment to the substrate after being performed with the second exposure treatment in order to fully dissolve the photoresist covered on the first function layer.

Wherein, the first etching treatment is a wet etching treatment, the second etching treatment is a dry etching treatment and the third etching treatment is a wet etching treatment.

Wherein, the step of using a first mask to perform a first exposure treatment to the substrate coated with the photoresist comprises: utilizing a gray-tone mask technology or a half-tone mask technology to use the first mask to perform the first exposure treatment to the substrate coated with the photoresist.

Wherein, each of the first function layer, the second function layer and the third function layer is a conductor material or a semiconductor material.

Wherein, the first function layer is a gate electrode of a gate layer, the second function layer is a-Si of a silicon layer, and the third function layer is a source electrode and a drain electrode of a source-drain layer and a data line of a data layer.

The beneficial effect of the present invention is: comparing to the conventional art, in the embodiment of the present invention, the first light-shielding insulation layer is formed on the substrate, used for blocking a portion light entering the substrate, and including: a first region and a second region which are disposed separately, and are both formed by insulation materials; the first function layer is formed on the second region of the first light-shielding insulation layer, and under the light-shielding function of the second region of the first light-shielding insulation layer, the affection of light can be avoided; the second function layer is formed above the first region of the first light-shielding insulation layer and the first function layer, and under the light-shielding function of the first light-shielding insulation layer, the affection of light can be avoided; the third function layer is formed above the second function layer, and under the light-shielding function of the first light-shielding insulation layer, the affection of light can be avoided. Because each of the first function layer, the second function layer and the third function layer can avoid the affection of light under the light-shielding function of the first light-shielding insulation layer, and the first light-shielding insulation layer is made of an insulation material. Through the above method, each function layer will not be irradiated by the light in order to avoid the photo-leakage current problem.

DETAILED DESCRIPTION OF THE PREFERRED EMBODIMENT

The following content combines with the drawings and the embodiment for describing the present invention in detail.

Figure 1:
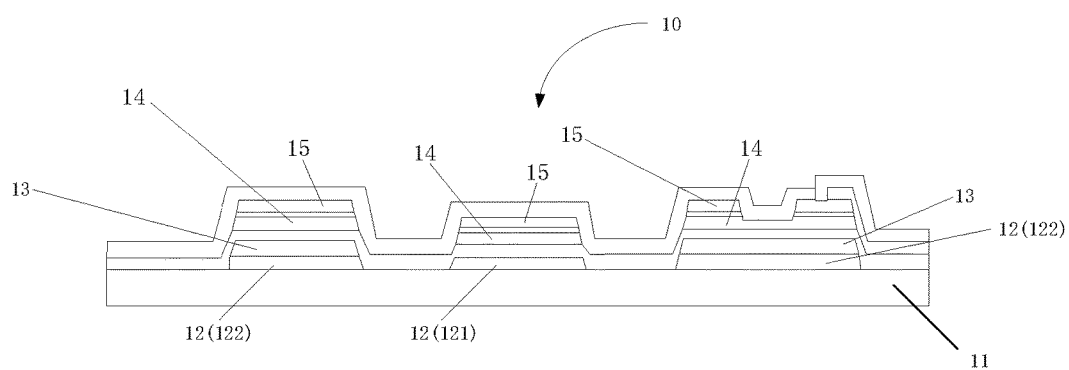
FIG. 1 is a schematic diagram of an array substrate of an embodiment of the present invention.

With reference to FIG. 1, and FIG. 1 is a schematic diagram of an array substrate of an embodiment of the present invention. The array substrate 10 includes: a substrate 11, a first light-shielding insulation layer 12, a first function layer 13, a second function layer 14 and a third function layer 15.

The first light-shielding insulation layer 12 is formed on the substrate 11, used for blocking a portion of light entering to the substrate 11, and the first light-shielding insulation layer 12 includes: a first region 121 and a second region 122 disposed separately, and the first region 121 and the second region 122 are both made of an insulation material such as a plastic material or a black matrix material.

The first function layer 13 is formed on the second region 122 of the first light-shielding insulation layer 12, used for realizing a first function, and the first function is determined according to an actual application, and under the light-shielding function of the second region 122 of the first light-shielding insulation layer 12, an affection of the light is avoided.

The second function layer 14 is formed above the first region 121 of the first light-shielding insulation layer 12, and formed above the first function layer 13. That is, a portion of the second function layer is formed above the first region 121 of the first light-shielding insulation layer 12, the other portion of the second function layer is formed above the first function layer 13, and also located above the second region 122 of the first light-shielding insulation layer 12. Accordingly, the second function layer 14 can avoid the affection of the light under the light-shielding function of the first light-shielding insulation layer 12. The second function layer 14 is used for realizing a second function, and the second function is determined according to an actual application.

The third function 15 is formed above the second function layer 14, used for realizing a third function. The third function is also determined according to an actual requirement. The second function 14 can avoid the affection of the light under the light-shielding function of the first light-shielding insulation layer 12, and the third function layer 15 is formed above the second function layer 14. Accordingly, the third function layer 15 can also avoid the affection of the light under the light-shielding function of the first light-shielding insulation layer.

Wherein, each of the first function layer 13, the second function layer 14 and the third function layer 15 is a conductor material or a semiconductor material.

Wherein, the first function layer 13 is a gate electrode of a gate layer, the second function layer 14 is a-Si of a silicon layer, and the third function layer 15 is a source electrode and a drain electrode of a source-drain layer and a data line of a data layer.

In the embodiment of the present invention, the first light-shielding insulation layer is formed on the substrate, used for blocking a portion light entering the substrate, and including: a first region and a second region which are disposed separately, and are both formed by insulation materials; the first function layer is formed on the second region of the first light-shielding insulation layer, and under the light-shielding function of the second region of the first light-shielding insulation layer, the affection of light can be avoided; the second function layer is formed above the first region of the first light-shielding insulation layer and the first function layer, and under the light-shielding function of the first light-shielding insulation layer, the affection of light can be avoided; the third function layer is formed above the second function layer, and under the light-shielding function of the first light-shielding insulation layer, the affection of light can be avoided. Because each of the first function layer, the second function layer and the third function layer can avoid the affection of light under the light-shielding function of the first light-shielding insulation layer, and the first light-shielding insulation layer is made of an insulation material. Through the above method, each function layer will not be irradiated by the light in order to avoid the photo-leakage current problem.

Figure 2:
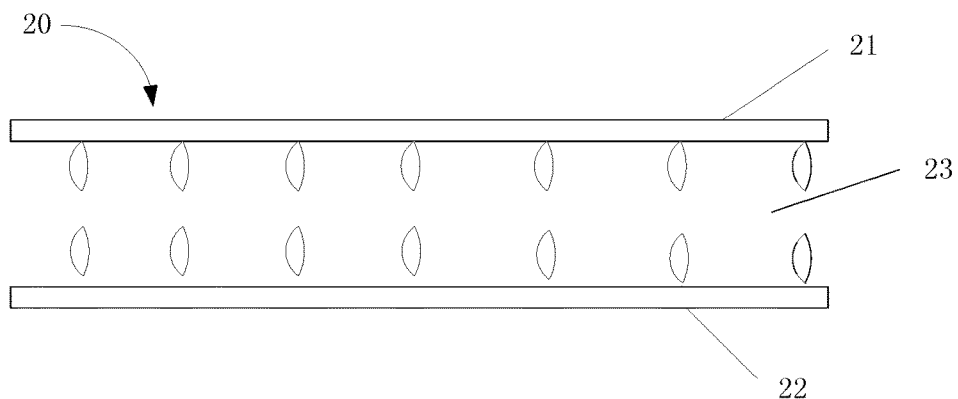
FIG. 2 is a schematic diagram of a liquid crystal panel of an embodiment of the present invention.

With reference to FIG. 2, and FIG. 2 is a schematic of a liquid crystal display panel of an embodiment of the present invention. The liquid crystal display panel 20 includes: a first substrate 21, a second substrate 22 and a liquid crystal layer 23 disposed between the first substrate 21 and the second substrate 22. The second substrate 22 is opposite to the first substrate 21. The liquid crystal layer 23 is clamped between the first substrate 21 and the second substrate 22. The specific structure of the second substrate 22 is basically the same as the array substrate described above. The portion of the second substrate 22 same as FIG. 1 can refer to FIG. 1 and related text description, no more repeating here.

The second substrate includes: a substrate, a first light-shielding insulation layer, a first function layer, a second function layer and a third function layer.

The first light-shielding insulation layer is formed on the substrate, used for blocking a portion light entering to the substrate, and including: a first region and a second region which are disposed separately, and are both formed by insulation materials; the first function layer is formed on the second region of the first light-shielding insulation layer, used for realizing a first function, and under the light-shielding function of the second region of the first light-shielding insulation layer, the affection of light can be avoided; the second function layer is formed above the first region of the first light-shielding insulation layer and the first function layer, and under the light-shielding function of the first light-shielding insulation layer, the affection of light can be avoided; the third function layer is formed above the second function layer, and under the light-shielding function of the first light-shielding insulation layer, the affection of light can be avoided. Wherein, each of the first function layer, the second function layer and the third function layer is a conductor material or a semiconductor material.

Wherein, the first function layer is a gate electrode of a gate layer, the second function layer is a-Si of a silicon layer, and the third function layer is a source electrode and a drain electrode of a source-drain layer, and a data line of a data layer.

In the embodiment of the present invention, the first light-shielding insulation layer is formed on the substrate, used for blocking a portion light entering to the substrate, and including: a first region and a second region which are disposed separately, and are both formed by insulation materials; the first function layer is formed on the second region of the first light-shielding insulation layer, and under the light-shielding function of the second region of the first light-shielding insulation layer, the affection of light can be avoided; the second function layer is formed above the first region of the first light-shielding insulation layer and the first function layer, and under the light-shielding function of the first light-shielding insulation layer, the affection of light can be avoided; the third function layer is formed above the second function layer, and under the light-shielding function of the first light-shielding insulation layer, the affection of light can be avoided. Because each of the first function layer, the second function layer and the third function layer can avoid the affection of light under the light-shielding function of the first light-shielding insulation layer, and the first light-shielding insulation layer is made of an insulation material. Through the above method, each function layer will not be irradiated by the light in order to avoid the photo-leakage current problem.

Figure 3:
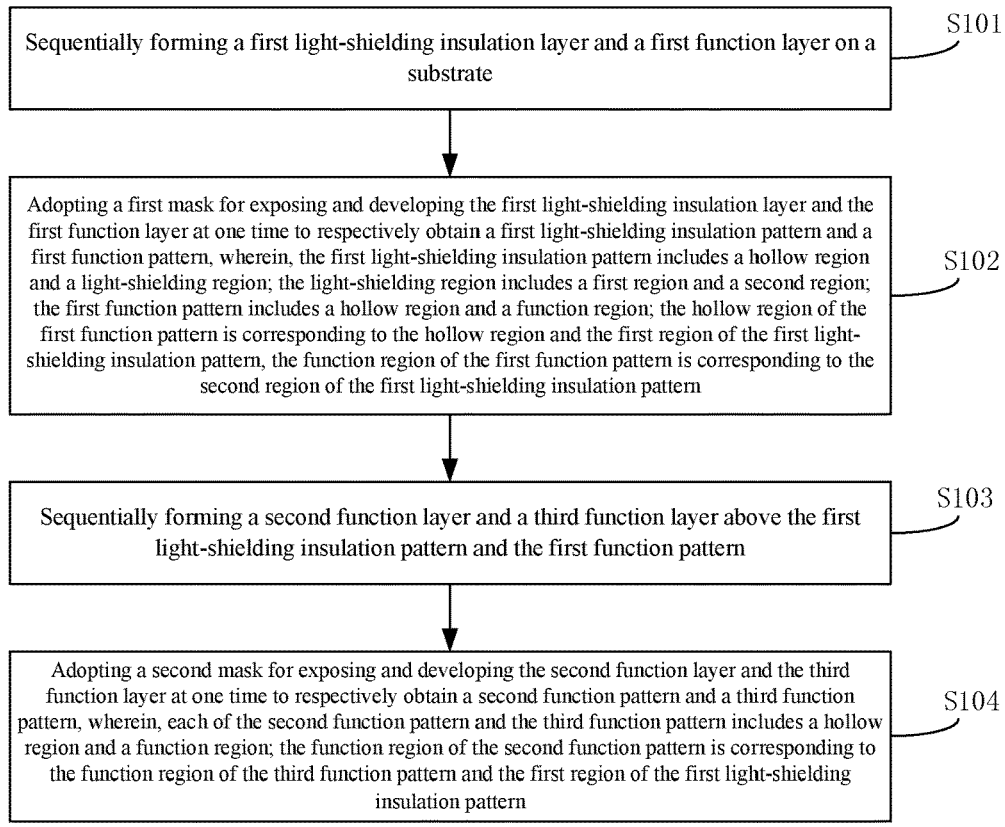
FIG. 3 is a flow chart of a manufacturing method for an array substrate of an embodiment of the present invention.

With reference to FIG. 3, and FIG. 3 is a flow chart of a manufacturing method for an array substrate of an embodiment of the present invention, the method includes:

Step S101: sequentially forming a first light-shielding insulation layer and a first function layer on a substrate.

The material of the first light-shielding insulation layer is an insulation layer such as a plastic material or a black matrix material.

The material of the first function layer is a conductor material or a semiconductor material.

Step S102: adopting a first mask for exposing and developing the first light-shielding insulation layer and the first function layer at one time to respectively obtain a first light-shielding insulation pattern and a first function pattern, wherein, the first light-shielding insulation pattern includes a hollow region and a light-shielding region; the light-shielding region includes a first region and a second region; the first function pattern includes a hollow region and a function region; the hollow region of the first function pattern is corresponding to the hollow region and the first region of the first light-shielding insulation pattern, the function region of the first function pattern is corresponding to the second region of the first light-shielding insulation pattern.

Designing the structure of the first mask, selecting the material of each structure of the first mask. Through exposing the first light-shielding insulation layer and the first function layer at one time, then, developing, the first light-shielding insulation pattern and the first function pattern can be obtained. The structure of the first mask and the selecting of the material of each structure are not limited here.

After exposing and developing the first light-shielding insulation layer, the first light-shielding insulation layer at some regions is stripped, and the first light-shielding insulation layer at some regions is still maintained in order to form the first light-shielding insulation pattern. The light-shielding insulation pattern includes a hollow region and a light-shielding region. The hollow region is a region that after developing, the material of the first light-shielding insulation layer is stripped. The light-shielding region is a region that after developing, the material of the first light-shielding insulation layer is still maintained. The light-shielding region includes a first region and a second region.

After exposing and developing the first function layer, the material of the first function layer at some regions is stripped, the material of the first function layer at some regions is still maintained in order to obtain the first function pattern. The first function pattern includes a hollow region and a function region. The hollow region is a region that after developing, the material of the first function layer is stripped. The function region is a region that after developing the material of the first function layer is still maintained. The function region is for realizing a first function, and the first function is specifically determined according to an actual application.

Wherein, between the first function pattern and the first light-shielding insulation pattern, a corresponding relationship is existed. Specifically is: the hollow region of the first function pattern is corresponding to the hollow region of the first light-shielding insulation pattern and the first region; the function region of the first function pattern is corresponding to the second region of the first light-shielding insulation pattern.

Step S103: sequentially forming a second function layer and a third function layer above the first light-shielding insulation pattern and the first function pattern.

Wherein, a material of each of the second function layer and the third function layer is a conductor material or a semiconductor material.

Step S104: adopting a second mask for exposing and developing the second function layer and the third function layer at one time to respectively obtain a second function pattern and a third function pattern, wherein, each of the second function pattern and the third function pattern includes a hollow region and a function region; the function region of the second function pattern is corresponding to the function region of the third function pattern and the first region of the first light-shielding insulation pattern.

Designing the structure of the second mask, selecting the material of each structure of the second mask. Through exposing the second function layer and the third function layer, then, developing, the second function pattern and the third function pattern can be obtained. The structure of the second mask and the selecting of the material of each structure are not limited here.

After exposing and developing the second function layer, the material of the second function layer at some regions is stripped, the material of the second function layer at some regions is still maintained in order to obtain the second function pattern. The second function pattern includes a hollow region and a function region. The hollow region is a region that after developing, the material of the second function layer is stripped. The function region is a region that after developing the material of the second function layer is still maintained. The function region is for realizing a second function, and the second function is specifically determined according to an actual application.

After exposing and developing the third function layer, the material of the third function layer at some regions is stripped, the material of the third function layer at some regions is still maintained in order to obtain the third function pattern. The third function pattern includes a hollow region and a function region. The hollow region is a region that after developing, the material of the third function layer is stripped. The function region is a region that after developing the material of the third function layer is still maintained. The function region is for realizing a third function, and the third function is specifically determined according to an actual application.

Wherein, between the second function pattern, the third function pattern and the first light-shielding insulation pattern, a corresponding relationship is existed. Specifically is: the function region of the second function pattern is corresponding to the function region of the third function pattern and the first region of first light-shielding insulation pattern.

In the embodiment of the present invention, sequentially forming a first light-shielding insulation layer and a first function layer on the substrate; adopting a first mask for exposing and developing the first light-shielding insulation layer and the first function layer at one time to respectively obtain a first light-shielding pattern and a first function pattern, the first light-shielding insulation pattern includes a hollow region and a light-shielding region, the light-shielding region includes a first region and a second region, the first function pattern includes a hollow region and a function region, the hollow region of the first function pattern is corresponding to the hollow region of the first light-shielding region and the first region, the function region of the first function pattern is corresponding to the second region of the first light-shielding insulation pattern; sequentially forming a second function layer and a third function layer above the first light-shielding insulation pattern and the first function pattern; adopting a second mask for exposing and developing the second function layer and the third function layer at one time to respectively obtain a second function pattern and a third function pattern. Each of the second function pattern and the third function pattern includes a hollow region and a function region. The function region of the second function pattern is corresponding to the function region of the third function pattern and the first region of the first light-shielding insulation pattern.

Because adopting the first mask for exposing and developing the first light-shielding insulation layer and the first function layer at one time in order to obtain the first light-shielding insulation pattern and the first function pattern. Then, obtaining the second function pattern and the third function pattern, and the function region of the first function pattern, the function region of the second function pattern and the function region of the third function pattern are respectively corresponds to the second region and the first region of the first light-shielding insulation pattern. Through above way, without increasing the number of the mask, without affecting the production capacity, each function layer of the array substrate manufactured by the present invention will not be irradiated by the light in order to avoid the photo-leakage current problem.

Figure 4:
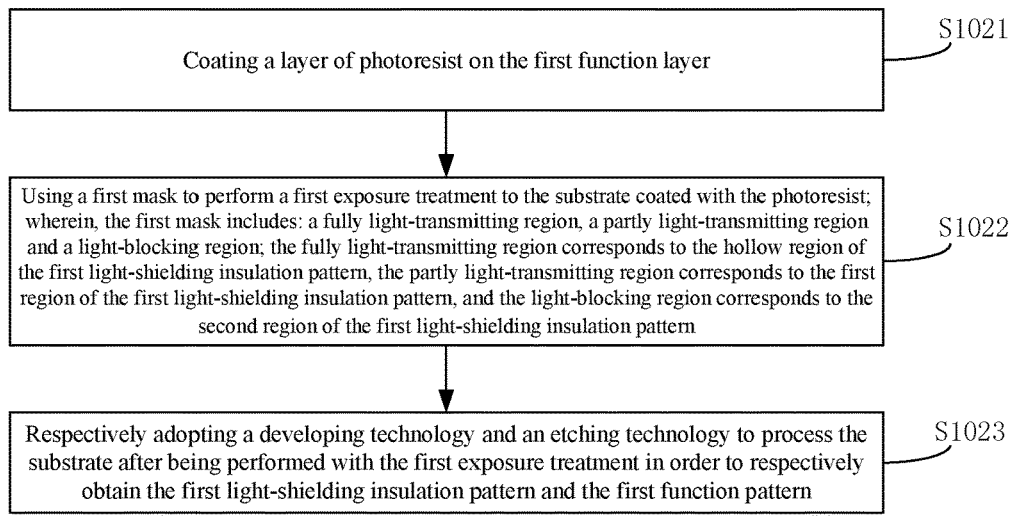
FIG. 4 is a flow chart of a manufacturing method for an array substrate of another embodiment of the present invention.

Wherein, with reference to FIG. 4, the step S102 can include: a sub-step S1021, a sub-step S1022 and a sub-step S1023.

The step S1021: coating a layer of photoresist on the first function layer.

The sub-step S1022: using a first mask to perform a first exposure treatment to the substrate coated with the photoresist. Wherein, with reference to FIG. 5, the first mask 30 includes: a fully light-transmitting region 31, a partly light-transmitting region 32 and a light-blocking region 33. The material of the fully light-transmitting region 31 can fully pass through a light theoretically, the material of the partly light-transmitting region 32 can pass through part of a light, and the material of the light-blocking region 33 can fully block a light without allowing a light to pass through. The fully light-transmitting region 31 corresponds to the hollow region of the first light-shielding insulation pattern, the partly light-transmitting region 32 corresponds to the first region of the first light-shielding insulation pattern, and the light-blocking region 33 corresponds to the second region of the first light-shielding insulation pattern.

The sub-step S1023: respectively adopting a developing technology and an etching technology to process the substrate after being performed with the first exposure treatment in order to respectively obtain the first light-shielding insulation pattern and the first function pattern.

Wherein, a material of the first light-shielding insulation layer is a black matrix.

Figure 6:
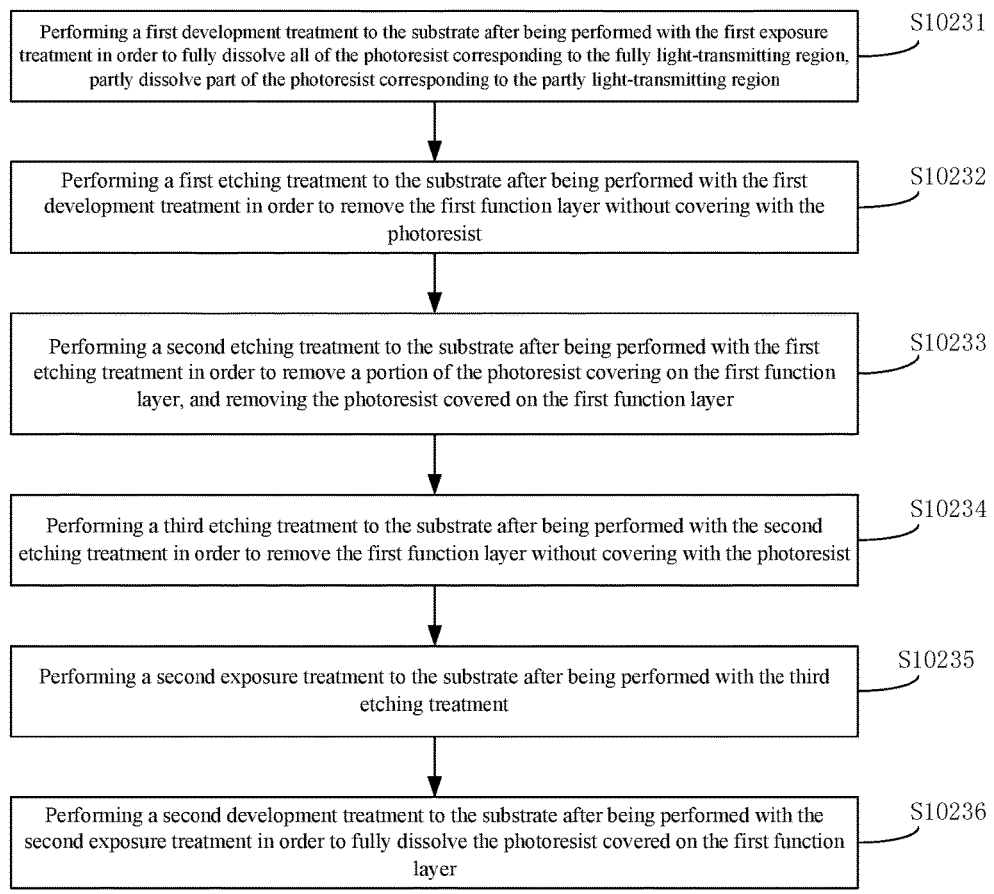
FIG. 6 is a flow chart a manufacturing method for an array substrate of another embodiment of the present invention.

Wherein, with reference to FIG. 6, the sub-step S1023 includes a sub-step S10231, a sub-step S10232, a sub-step S10233, a sub-step S10234, a sub-step S10235 and a sub-step S10236.

The sub-step S10231, performing a first development treatment to the substrate after being performed with the first exposure treatment in order to fully dissolve all of the photoresist corresponding to the fully light-transmitting region, partly dissolve part of the photoresist corresponding to the partly light-transmitting region.

The sub-step S10232: performing a first etching treatment to the substrate after being performed with the first development treatment in order to remove the first function layer without covering with the photoresist.

The sub-step S10233: performing a second etching treatment to the substrate after being performed with the first etching treatment in order to remove a portion of the photoresist covering on the first function layer, and removing the photoresist covered on the first function layer.

The sub-step S10234: performing a third etching treatment to the substrate after being performed with the second etching treatment in order to remove the first function layer without covering with the photoresist.

The sub-step S10235: performing a second exposure treatment to the substrate after being performed with the third etching treatment.

The sub-step S10236: performing a second development treatment to the substrate after being performed with the second exposure treatment in order to fully dissolve the photoresist covered on the first function layer.

Wherein, the first etching treatment is a wet etching treatment, the second etching treatment is a dry etching treatment and the third etching treatment is a wet etching treatment.

Wherein, the step of using a first mask to perform a first exposure treatment to the substrate coated with the photoresist comprises: utilizing a gray-tone mask technology or a half-tone mask technology to use the first mask to perform the first exposure treatment to the substrate coated with the photoresist.

Figure 5:
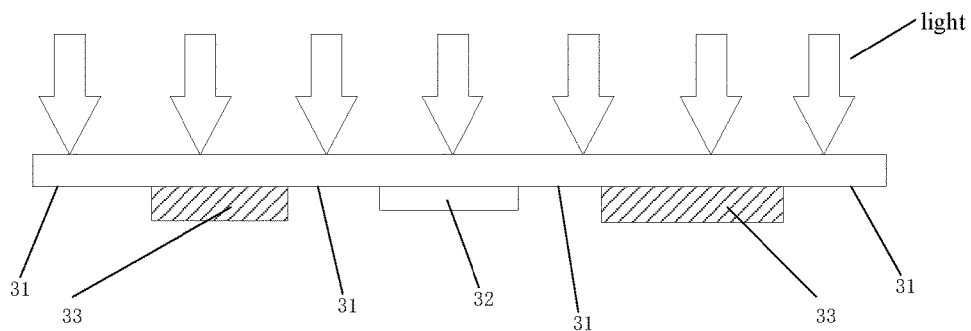
FIG. 5 is a schematic diagram of a first mask in the manufacturing method for an array substrate of an embodiment of the present invention.

The following content adopts a glass substrate, the material of the first light-shielding insulation layer is a Black Matrix (abbreviated as BM), the first function layer is finally manufactured as a gate electrode of a gate layer, the second function layer is finally manufactured as a-Si of a silicon layer, and the third function layer is finally manufactured as a source electrode and a drain electrode of a source-drain layer and a data line of a data layer, and the first mask shown in FIG. 5 as an example to illustrate the above method.

Figure 7:
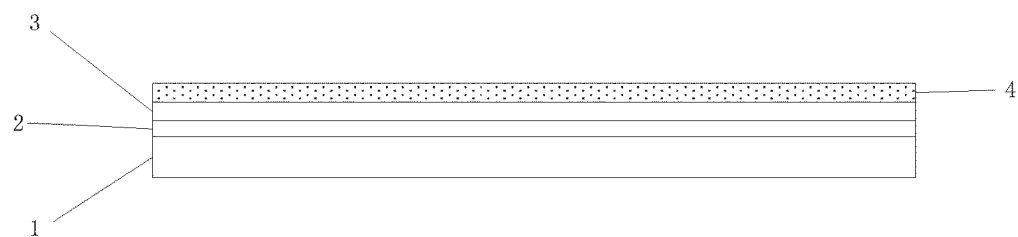
FIG. 7 is a first schematic diagram of an actual application of the manufacturing method for an array substrate of the present invention.

With reference to FIG. 7 to FIG. 14, in FIG. 7, after cleaning the glass substrate 1, sequentially forming films according to an order of coating a black matrix (BM) layer 2 and coating a gate electrode (GE) layer 3. On the GE layer 3, coating a photoresist layer 4 (abbreviated as PR).

Figure 8:
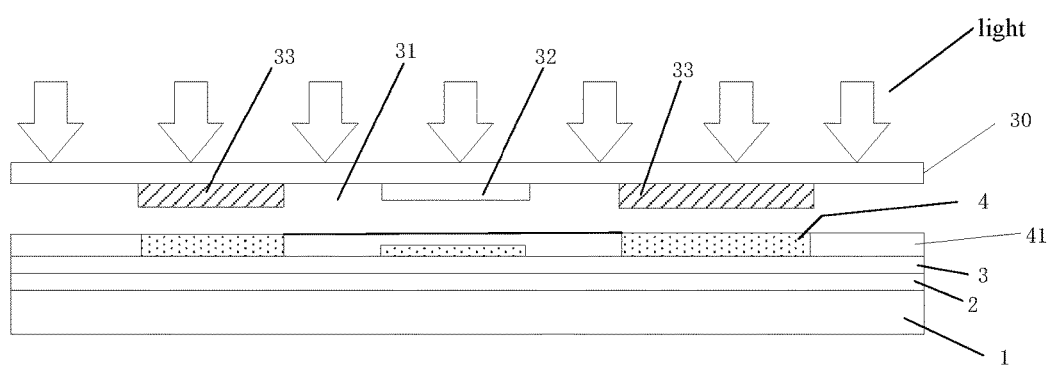
FIG. 8 is a second schematic diagram of an actual application of the manufacturing method for an array substrate of the present invention.

With reference to FIG. 8, using the first mask 30 shown in FIG. 5, the first mask 30 includes a fully light-transmitting region 31, a partly light-transmitting region 32 and a light-blocking region 33; through a gray-tone mask (GTM) or a half-tone mask (HTM) to perform a first exposure. A region that does not require the GE material is fully light-transmitting. After irradiating by the fully light-transmitting light, the photoresist 4 become an irradiated photoresist 41. A region that require to maintain the GE material and the BM material is light-blocking, and the original photoresist 4 is maintained. A region that does not require the GE material but requires the BM material is partly light-transmitting. Through partly light-transmitting irradiation, one portion that under an irradiation becomes an irradiated photoresist 41, another portion without under the irradiation is still the original photoresist 4.

Figure 9:
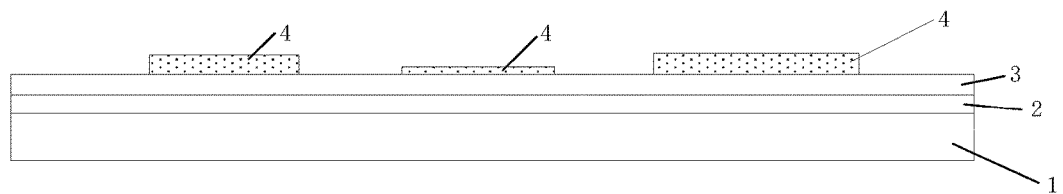
FIG. 9 is a third schematic diagram of an actual application of the manufacturing method for an array substrate of the present invention.
Figure 10:
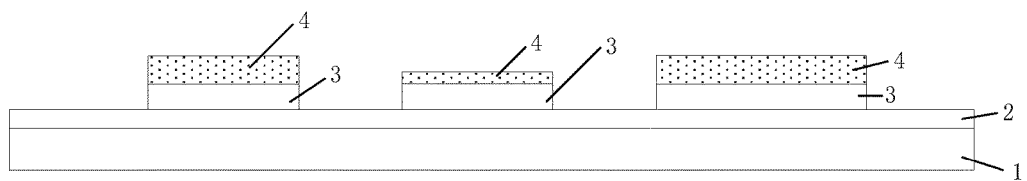
FIG. 10 is a fourth schematic diagram of an actual application of the manufacturing method for an array substrate of the present invention.
Figure 11:
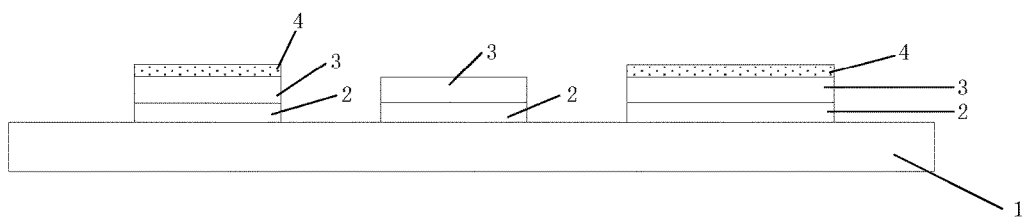
FIG. 11 is a fifth schematic diagram of an actual application of the manufacturing method for an array substrate of the present invention.
Figure 12:
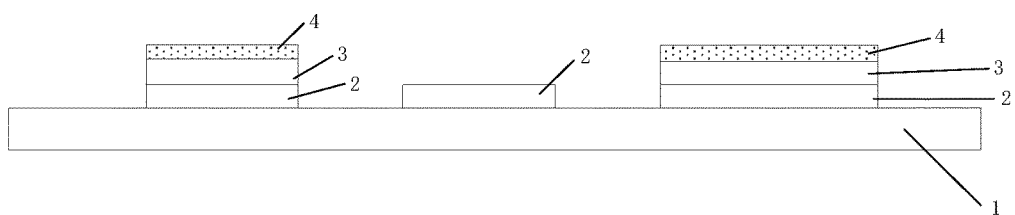
FIG. 12 is a sixth schematic diagram of an actual application of the manufacturing method for an array substrate of the present invention.
Figure 13:
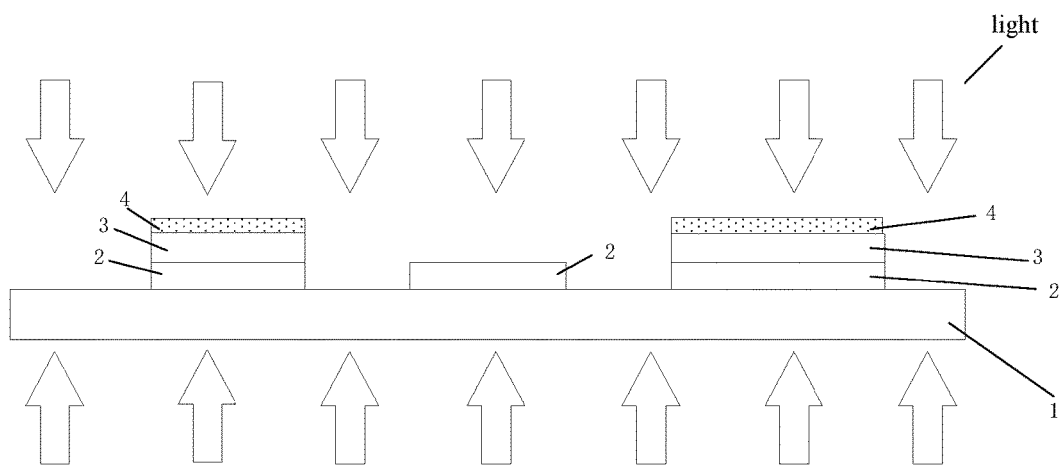
FIG. 13 is a seventh schematic diagram of an actual application of the manufacturing method for an array substrate of the present invention.
Figure 14:
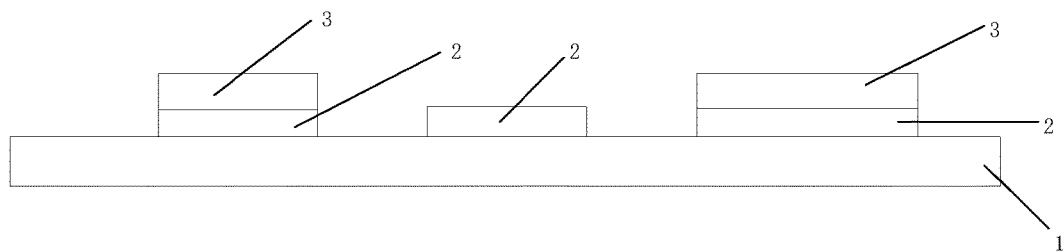
FIG. 14 is an eighth schematic diagram of an actual application of the manufacturing method for an array substrate of the present invention.

After exposing, a PR developing is performed, and a pattern as shown in FIG. 9 is obtained. Then, performing a wet etching to the GE material, and a pattern as shown in FIG. 10 is obtained. Then, performing a dry etching to a remaining PR material and the BM material to obtain a pattern as shown in FIG. 11. At this time, the GE material on the BM material is not protect by the PR, and wet etching the exposed GE material to obtain a pattern as shown in FIG. 12. At this time, a manufacturing for the GE material is finished, and the remaining PR is required to perform exposing and developing so as to remove the PR, and curing the BM material at the same time, as shown in FIG. 13. After PR developing and BM curing, a final pattern is as shown in FIG. 14 in order to finish the manufacturing for the BM layer and the GE layer.

Then, according to a conventional four-mask process to manufacture a dielectric layer, an a-Si layer, a data layer, a passivation layer, via hole and ITO layer. After the array substrate is finished, according to the conventional process to manufacture a color filter (CF) substrate, perform a cell alignment and manufacture a module in order to finish a complete display panel.

Through above way, the photo-leakage problem generated by irradiating the a-Si below the data line in the four-mask technology can be solved without increasing the number of the masks and affecting production capacity.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for an array substrate, comprising:
   sequentially forming a first light-shielding insulation layer and a first function layer on a substrate;
   adopting a first mask for exposing and developing the first light-shielding insulation layer and the first function layer at one time to respectively obtain a first light-shielding insulation pattern and a first function pattern, wherein, the first light-shielding insulation pattern includes a hollow region and a light-shielding region; the light-shielding region includes a first region and a second region; the first function pattern includes a hollow region and a function region; the hollow region of the first function pattern is corresponding to the hollow region and the first region of the first light-shielding insulation pattern, the function region of the first function pattern is corresponding to the second region of the first light-shielding insulation pattern;
   sequentially forming a second function layer and a third function layer above the first light-shielding insulation pattern and the first function pattern; and
   adopting a second mask for exposing and developing the second function layer and the third function layer at one time to respectively obtain a second function pattern and a third function pattern, wherein, each of the second function pattern and the third function pattern includes a hollow region and a function region; the function region of the second function pattern is corresponding to the function region of the third function pattern and the first region of the first light-shielding insulation pattern.

2. The manufacturing method according to claim 1, wherein, the step of adopting a first mask for exposing and developing the first light-shielding insulation layer and the first function layer at one time to respectively obtain a first light-shielding insulation pattern and a first function pattern comprises:
   coating a layer of photoresist on the first function layer;
   using a first mask to perform a first exposure treatment to the substrate coated with the photoresist, wherein, the first mask includes: a fully light-transmitting region, a partly light-transmitting region and a light-blocking region; the fully light-transmitting region corresponds to the hollow region of the first light-shielding insulation pattern, the partly light-transmitting region corresponds to the first region of the first light-shielding insulation pattern, and the light-blocking region corresponds to the second region of the first light-shielding insulation pattern; and
   respectively adopting a developing technology and an etching technology to process the substrate after being performed with the first exposure treatment in order to respectively obtain the first light-shielding insulation pattern and the first function pattern.

3. The method according to claim 2, wherein, a material of the first light-shielding insulation layer is a black matrix.

4. The method according to claim 2, wherein, the step of adopting a developing technology and an etching technology to process the substrate after being performed with the first exposure treatment comprises:
   performing a first development treatment to the substrate after being performed with the first exposure treatment in order to fully dissolve all of the photoresist corresponding to the fully light-transmitting region, partly dissolve part of the photoresist corresponding to the partly light-transmitting region;

performing a first etching treatment to the substrate after being performed with the first development treatment in order to remove the first function layer without covering with the photoresist;

performing a second etching treatment to the substrate after being performed with the first etching treatment in order to remove a portion of the photoresist covering on the first function layer, and removing the photoresist covered on the first function layer;

performing a third etching treatment to the substrate after being performed with the second etching treatment in order to remove the first function layer without covering with the photoresist;

performing a second exposure treatment to the substrate after being performed with the third etching treatment; and performing a second development treatment to the substrate after being performed with the second exposure treatment in order to fully dissolve the photoresist covered on the first function layer.

5. The method according to claim 4, wherein, the first etching treatment is a wet etching treatment, the second etching treatment is a dry etching treatment and the third etching treatment is a wet etching treatment.

6. The method according to claim 2, wherein, the step of using a first mask to perform a first exposure treatment to the substrate coated with the photoresist comprises:

utilizing a gray-tone mask technology or a half-tone mask technology to use the first mask to perform the first exposure treatment to the substrate coated with the photoresist.

7. The method according to claim 1, wherein, each of the first function layer, the second function layer and the third function layer is a conductor material or a semiconductor material.

8. The method according to claim 1, wherein, the first function layer is a gate electrode of a gate layer, the second function layer is a-Si of a silicon layer, and the third function layer is a source electrode and a drain electrode of a source-drain layer and a data line of a data layer.

* * * * *